(12) United States Patent
Logiudice (10) Patent No.: US 6,661,275 B2
(45) Date of Patent: Dec. 9, 2003

(54) CIRCUIT ARRANGEMENT AND METHOD FOR DISCHARGING AT LEAST ONE CIRCUIT NODE

(75) Inventor: Andrea Logiudice, Padua (IT)

(73) Assignee: Infineon Technologies Aktiengesellschaft, München (DE)

( * ) Notice: Subject to any disclaimer, the term of this patent is extended or adjusted under 35 U.S.C. 154(b) by 0 days.

(21) Appl. No.: 10/195,583

(22) Filed: Jul. 12, 2002

(65) Prior Publication Data
US 2003/0016068 A1 Jan. 23, 2003

(30) Foreign Application Priority Data
Jul. 16, 2001 (DE) .......................................... 101 34 557

(51) Int. Cl.[7] .............................................. H03K 17/04
(52) U.S. Cl. ......................... 327/374; 327/376; 327/377
(58) Field of Search ................................. 327/374–377, 327/320, 330, 382, 392, 433, 434

(56) References Cited

U.S. PATENT DOCUMENTS

| | | | | |
|---|---|---|---|---|
| 3,677,261 A | * | 7/1972 | Day ............................ | 600/536 |
| 3,798,559 A | * | 3/1974 | Tomita et al. ............... | 327/311 |
| 3,859,543 A | * | 1/1975 | Milovancevic ............... | 327/393 |
| 4,443,719 A | * | 4/1984 | Planer et al. ................ | 327/421 |
| 4,492,883 A | * | 1/1985 | Janutka ....................... | 327/377 |
| 4,575,642 A | * | 3/1986 | Hochreutiner et al. ....... | 327/389 |
| 4,603,269 A | * | 7/1986 | Hochstein .................... | 327/432 |
| 4,865,538 A | * | 9/1989 | Scheele et al. ............... | 431/18 |
| 5,834,964 A | * | 11/1998 | Scheraga ..................... | 327/376 |

FOREIGN PATENT DOCUMENTS

| | | |
|---|---|---|
| DE | 41 22 978 | 6/1992 |
| JP | 64 78520 | 3/1989 |

\* cited by examiner

Primary Examiner—Tuan T. Lam
(74) Attorney, Agent, or Firm—Schiff Hardin & Waite (57) ABSTRACT

In a circuit arrangement for discharging at least one circuit node, an input and at least one output connectible to the at least one circuit node are provided along with at least one controllable resistor, a capacitor and a diode. A first terminal of the controllable path of the controllable resistor is connected to the output. A second terminal of the controllable path of the controllable resistor is connected to the input. A terminal of the capacitor and a cathode of the diode are connected to a control terminal of the controllable resistor. An anode of the diode is connected to the input. The circuit arrangement requires a very small area in an integrated circuit and enables a very fast discharge of the circuit node.

19 Claims, 6 Drawing Sheets

CIRCUIT ARRANGEMENT AND METHOD FOR DISCHARGING AT LEAST ONE CIRCUIT NODE

BACKGROUND OF THE INVENTION

1. Field of the Invention

The invention is directed to a circuit arrangement for discharging at least one circuit node, to an integrated circuit, and to a method for discharging at least one circuit node.

In integrated circuits, many circuit nodes have a comparatively great capacitance on which charges are stored during the operation of the circuit. A typical example of such a circuit node is the gate of an MOS (metal oxide semiconductor) transistor, whose capacitance is dependent on the channel length L and channel width W of the transistor.

After a supply voltage of an integrated circuit has been switched off, the charges stored on the circuit nodes—on their capacitances to be more precise—usually flow off. Dependent on the size of the capacitance of a circuit node and the size of the resistance of a path for the charge amounts to flow off, it can last a number of seconds until charges are no longer stored on the circuit node, i.e. until the capacitance of the circuit node has completely discharged.

Without additional circuit-oriented techniques, capacitances of circuit nodes frequently discharge via parasitic paths of the circuit that usually exhibit a very high resistance. As a result thereof, the discharge lasts very long; and it can lie in the range of minutes or even hours. In some integrated circuits, particularly from security-sensitive areas of employment such as, for example, automotive technology, however, it is usually undesired that the circuit nodes discharge slowly (for example, in the millisecond range).

A number of circuit—oriented methods are known from the Prior Art that enable a more or less fast discharge of circuit nodes after the supply voltage of an integrated circuit has been switched off.

Figure 1:
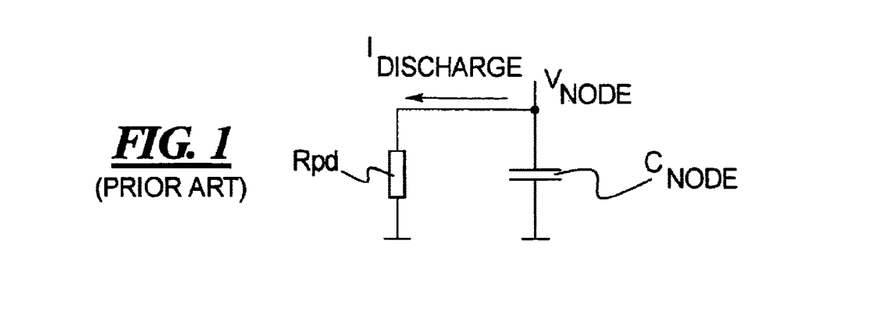
FIG. 1 a first circuit arrangement known from the Prior Art for discharging circuit nodes.

What is probably the simplest circuit for discharging a circuit node is shown in FIG. 1. The discharge of a charge stored on a capacitance $C_{node}$ of the circuit node that corresponds to a voltage $V_{node}$ thereby occurs via a passive resistor $R_{pd}$ as a discharge current $I_{discharge}$. Given a disconnect or an outage of the supply voltage, the charges stored on the capacitance $C_{node}$ can flow off over the passive resistor $R_{pd}$ because of its self-conducting property.

Particularly given an integration, however, the resistor is subject to two contradictory demands. First, it should be high-impedance enough so that the integrated circuit is not additionally loaded and the power consumption remains in limits. During operation of the circuit, a current always fundamentally flows across the resistor. On the other hand, it must be low-impedance enough for an integration and, moreover, must be dimensioned such that the voltage $V_{node}$ stored on the capacitance $C_{node}$ can be discharged as quickly as possible. The integration of such resistors, however, is very surface-intensive and is therefore cost-unbeneficial and is also not possible at all in some semiconductor technologies.

Figure 2:
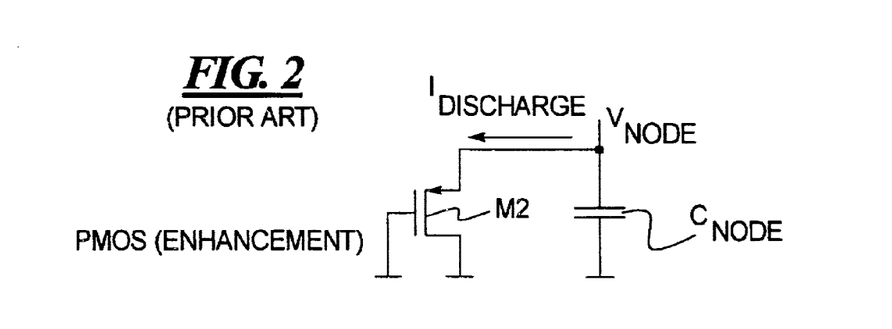
FIG. 2 a second circuit arrangement known from the Prior Art for discharging circuit nodes.

The circuit for discharging a circuit node that is shown in FIG. 2 was therefore developed. In this circuit, the passive resistor has been replaced by an enhancement PMOS transistor. The gate terminal and the drain terminal of this transistor are connected to ground. The transistor can be integrated far more easily than the passive resistor. Above all, it requires far, far less surface. The voltage $V_{node}$ to be discharged is present at the source terminal of the transistor, this voltage essentially corresponding to the charges stored on the capacitance $C_{node}$. The discharge current discharge flows off to ground via the channel.

What is disadvantageous about this circuit, however, is that the discharge event only lasts until the voltage at the source terminal has reached the threshold voltage of the MOS transistor and the transistor consequently becomes high-impedance. In other words, the transistor becomes extremely high-impedance and inhibits when the gate-source voltage falls below the threshold voltage. A residual charge thus remains stored on the capacitance $C_{node}$ and this can only flow off on the basis of leakage currents, but not across the inhibited transistor. The discharge by means of leakage currents, however, lasts a number of minutes.

Figure 3:
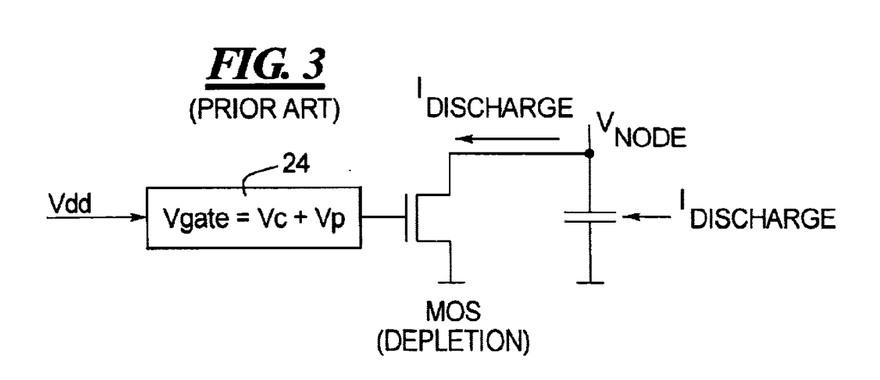
FIG. 3 a third circuit arrangement known from the Prior Art for discharging circuit nodes.

Another circuit for discharging voltage nodes is shown in FIG. 3. Here, the capacitance of the circuit node is discharged via a depletion MOS transistor. The depletion MOS transistor can also be a JFET (unction field effect transistor). What is thereby essential is that such transistors are conductive in a non-supplied condition and inhibit in a supplied condition. What is understood by unsupplied condition is a voltage-free condition and what is understood by a supplied condition is a normal operating condition in which a supply voltage is present at the circuit.

The transistor is thus of the self-conducting type. This is achieved by an implanted channel. However, the transistor becomes more expensive as a result thereof since an additional process step is required in the manufacture. Moreover, the voltage at the gate terminal or back gate terminal of the transistor must exceed the voltage at the source terminal and drain terminal by what is referred to as the pinch-off voltage so that the transistor can inhibit. When, however, the circuit node to be discharged already lies at a voltage that roughly corresponds to the supply voltage, it can be necessary to boost the voltage at the gate terminal of the transistor to a voltage that is higher than the supply voltage. This is achieved by a charge pump 24. However, the complexity of the circuit is again increased as a result thereof.

Figure 4:
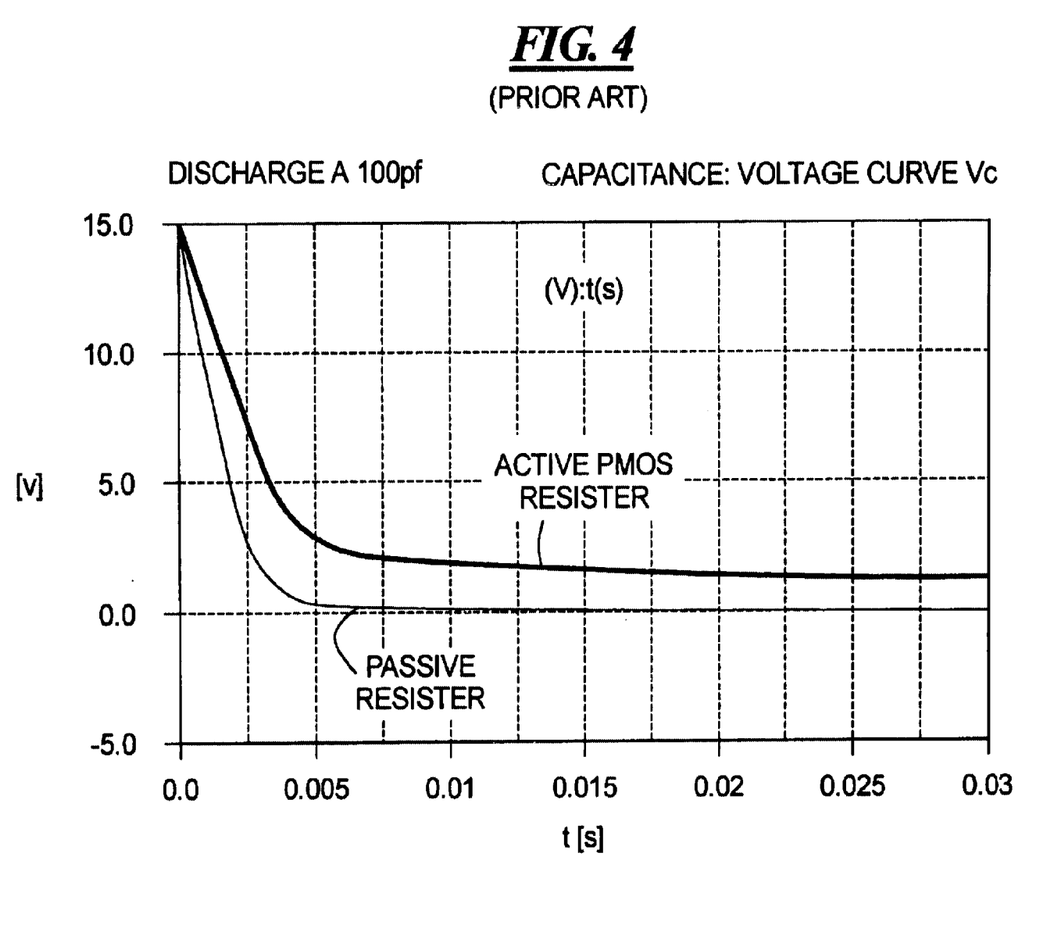
FIG. 4 is a time/voltage diagram with two discharge curves of a circuit node that is discharged on the one hand with the circuit arrangement according to FIG. 1 and on the one hand with the circuit arrangement according to FIG. 2.

FIG. 4 shows the typical discharge curves of a circuit node having a capacitance of 100 pF. The circuit node—the capacitance thereof to be more precise—is charged to 15 V.

The lower discharge curve shows the discharge of the circuit node via a passive resistor, for example with the circuit shown in FIG. 1. The capacitance of the circuit node has been nearly completely discharged here after about 10 ms.

The upper curve represents the discharge with a circuit as shown in FIG. 2. The discharge occurs via an active PMOS resistor or transistor. The inhibiting effect of the resistance already shows up here when the charge stored on the capacitance or the corresponding voltage drops below the threshold voltage of the transistor. The circuit node cannot discharge completely with this circuit. A residual voltage remains.

In summary, the following can be said about the circuits known from the Prior Art.

Although a discharge via a passive resistor enables a nearly complete discharge of the capacitance of the circuit node, such a resistor—because of its large area—cannot be integrated or can only be integrated with difficulty. Further, the resistor represents an additional load for the circuit in the normal operating condition since a current always flows across it. Finally, the discharge time is proportional to the value of resistance, as a result whereof long discharge times of the circuit node result. Moreover, each critical circuit node, i.e. each circuit node that has a great capacitance and/or that must be discharged quickly after a shut-off of the supply voltages, needs such an element (referred to as a pull-down resistor), as a result whereof a higher surface requirement results overall.

The active resistor, which is preferably realized by means of a PMOS transistor, in fact has a smaller area than the passive resistor but—as the upper discharge curve in FIG. 4 shows—does not enable a nearly complete discharge of a capacitative circuit node. It, too, represents an additional load for the circuit in the supplied condition or, respectively, in the operating condition since a current always flows across it during operation. Further, the discharge time is proportional to the value of resistance of the channel of the transistor, a long discharge time resulting therefrom. In principle, every critical circuit node given this circuit also requires its own circuit element of this type, a rather high surface requirement in an integration deriving overall as a result thereof.

Finally, the circuit shown in FIG. 3 has the advantage that the capacitance of a circuit node can be approximately completely discharged. Due to an additional process step for the depletion MOS transistor, however, it is very expensive and can therefore not be cost-beneficially implemented in many low-cost semiconductor technologies. Due to the charge pump 24, moreover, the circuit is very complex.

SUMMARY OF THE INVENTION

It is therefore an object of the present invention to propose a circuit arrangement and a method for discharging at least one circuit node that enables a cost-beneficial integration and a nearly complete discharging of the at least one circuit node within a relatively short time.

According to the present invention, a circuit arrangement is provided for discharging at least one circuit node. An input and at least one output are provided together with at least one controllable resistor, a capacitor, and a diode. A first terminal of a controllable path of the controllable resistor is connected to the output. A second terminal of the controllable path of the controllable resistor is connected to the input. The terminal of the capacitor and a cathode of the diode are connected to a control terminal of the controllable resistor. An anode of the diode is connected to the input. An integrated circuit is also provided wherein at least one output is connected to at least one circuit node of the integrated circuit, and a voltage that derives from a voltage source of the integrated circuit is present at the input. In a method for discharging at least one circuit node, a charge is stored on the capacitor, a discharge of said charge being delayed even after a disconnect of a supply voltage; and wherein a controllable resistor is controlled such that after a disconnect of the supply voltage, the resistor is conducted for a predetermined time duration within which the circuit node discharge is nearly complete. Further advantageous embodiments, developments and aspects of the present invention derive from the specification and the accompanying drawings.

DESCRIPTION OF THE PREFERRED EMBODIMENTS

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

The introduction to the specification is referenced for the description of FIGS. 1–4. Identical and functionally identical elements can be provided with the same reference characters below.

An essential idea is to specify a circuit with optimally few components that enables a simple integration. Further, the circuit should be of such a nature that a comparatively short charging time within which a circuit node can be nearly completely discharged is achieved compared to the Prior Art.

This is achieved by a circuit arrangement for discharging at least one circuit node that comprises an input and at least one output. The circuit arrangement further comprises at least one controllable resistor, a capacitor and a diode. A first terminal of the controllable path of the controllable resistor is connected to the output, whereas a second terminal of the controllable path of the controllable resistor is connected to the input. A terminal of the capacitor and the cathode of the diode are connected to the control terminal of the controllable resistor. The anode of the diode is connected to the input. This creates a circuit having a very simple structure that, due to its specific interconnection, has a functionality that enables a dependable and fast discharge of the capacitance of a circuit node.

A discharge current on the basis of the charges stored on the circuit node thereby flows into the output of the circuit. A supply voltage is present at the input of the circuit in normal operation. For example, the supply voltage can supply an integrated circuit having a circuit arrangement as disclosed hereafter. The input can also be connected to a reference voltage generated on an integrated circuit, for example a band-gap voltage.

The capacitor charges via the diode in the normal operating condition, i.e. when a voltage is present at the input. The voltage stored on the capacitor thereby amounts to roughly the voltage present at the input. The controllable resistor is high-impedance in this case. No current can therefore flow across its control path.

When the circuit proceeds from the supplied into the non-supplied condition, i.e. the voltage at the input drops or is completely turned off, the diode begins to inhibit, and the voltage of the capacitor is retained as a result thereof since no charges can flow off from the capacitor. A voltage difference forms between the terminals of the control path of the controllable resistor and its control terminal, as a result whereof the controllable resistor begins to conduct. As a result, a discharge current can flow from the circuit node via the output and via the control path.

The current through the controllable resistor is not limited and is essentially defined by the voltage of the capacitor and the parameters of the controllable resistor. Moreover, the control of the resistor is essentially dependent on the voltage at the capacitor, this usually dropping far, far more slowly than the voltage due to charges that are stored on the circuit node. As a result thereof, the control path of the controllable resistor remains high-impedance until nearly all of the charges have flowed off from the circuit node. A voltage discharge of a circuit node on which a charge is stored can occur very fast as a result of this active discharge circuit. Moreover, the circuit node can discharge nearly completely.

The second terminal of the controllable path of the controllable resistor is preferably connected to the input via a resistor. As a result, the discharge current that flows into the output of the circuit arrangement is limited. As a result thereof, circuit nodes that are charged to high voltages can also be discharged without damaging the circuit arrangement.

So that the voltage at the capacitor does not charge due to an undesired parasitic effect, the terminal of the capacitor can be connected to a clamping circuit in a preferred embodiment. Preferably, the clamping circuit is designed such that it limits the voltage at the capacitor to a sum voltage that approximately corresponds to the sum of a voltage present at the input and a threshold voltage of the controllable resistor.

In an alternative embodiment, a rise of the voltage at the capacitor can also be prevented in that the terminal of the capacitor is connected to a power source, particularly a voltage-controlled power source. As a result thereof, in particular, the continuous charging of the capacitor due to inverse saturation currents of the controllable resistor is prevented.

Preferably the clamping circuit and the power source are dimensioned such that a discharge of the capacitor is prevented when a voltage at the input decreases. In order to fully exploit the advantages of the circuit given an integration, the controllable resistor can be a transistor. An MOS transistor, an NPN bipolar transistor and/or a superbeta transistor, particularly a Darlington transistor or similar transistor, is preferably utilized here. The bipolar versions of transistors are particularly utilized when the circuit nodes to be discharged are at very high voltages for which the lower-voltage MOS transistors are more poorly suited or not suited at all. Given utilization of bipolar transistors, however, it must be taken into consideration that a base current flows and, thus, the capacitor is discharged. This must be taken into consideration in the dimensioning of the capacitor. Superbeta transistors such as Darlington stages have thus proven especially suitable. In order to be able to nearly completely dismantle the voltage at the circuit node, the following relationship should be adhered to in the dimensioning of the components:

$$C1*BETA*Vc > C_{node}*V_{node}$$

Vc is thereby the voltage at the capacitor C1. $C_{node}$ is the capacitance of the circuit node to be discharged. $V_{node}$ stands for the voltage at the circuit node due to the charges stored on the capacitance $C_{node}$. BETA, finally, stands for the gain factor of the transistor employed.

In a preferred embodiment, this is utilized as a pull-down resistor in an electronic circuit for discharging the gate of at least one JFET. For example, such JFETs are utilized in power circuits of automotive technology. Given an outage of the supply voltage, rather great charge amounts that are stored on the gates of the JFETs should be discharged as quickly as possible in order to place the overall circuit into a defined condition, i.e. a charge-free and voltage-free condition. The circuit arrangement is especially well suited for this.

In an especially preferred embodiment, the circuit arrangement is designed such that a capacitance of about 100 pF charged to approximately 15 V is nearly completely discharged after about 3 µs. Of course, the circuit arrangement is not limited to such values. On the contrary, it can be adapted to all possible applications by means of a corresponding dimensioning. The essential criterion for the adaptation is the desired discharge time after the disconnect or a collapse of the supply voltages of an electronic circuit.

As already repeatedly indicated, the circuit arrangement is preferably utilized in an integrated circuit. It is specifically in an integration that the circuit arrangement trumps the circuit known from the Prior Art with its advantages. It requires, namely, only a small surface, enables a relatively fast discharge event that typically lies in the µs range, and represents no additional load for an electronic circuit in normal operation. Further, it can be expanded in a simple way for discharging a plurality of circuit nodes by parallel connection of a plurality of controllable transistors corresponding to the plurality of circuit nodes to be discharged.

Let it be mentioned again here that the aforementioned clamping circuit and power source can be implemented with minimal transistors. As a result thereof, the surface requirement of the inventive circuit arrangement is increased only insignificantly, given an integration.

Moreover, the capacitor of the circuit arrangement can also be realized with an MOS transistor, which may potentially be more surface-beneficial than a capacitor specifically provided therefor (dependent on the semiconductor technology employed).

The surface requirement of a transistor utilized as controllable resistor can also be kept very small since only the W/L ratio defines the maximum discharge current.

A method is also provided for discharging at least one circuit node, whereby a charge is stored on a capacitance, the discharge thereof being delayed even after the disconnect of a supply voltage. The capacitor controls a controllable resistor such that the resistor conducts for a predetermined time duration after the supply voltage is shut off, the circuit node discharging nearly completely within said time duration. In other words this method makes it possible to discharge a circuit node relatively fast and with little expense.

Figure 5:
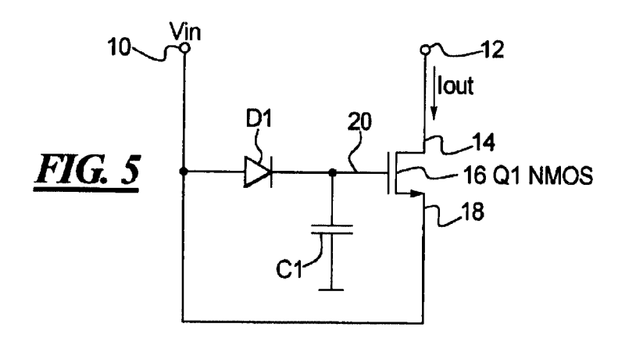
FIG. 5 is a first exemplary embodiment of the circuit arrangement.

The circuit arrangement shown in FIG. 5 comprises an input 10 and an output 12. The output 12 can be connected to a circuit node to be discharged. A voltage Vin as an input quantity of the circuit arrangement can be present at the input 10, the voltage Vin being proportional to a supply voltage of the circuit arrangement. Via the voltage Vin, a capacitor C1 is charged via a diode D1 in the normal operating condition. A terminal of the capacitor C1 is connected to the cathode of the diode D1 for this purpose. The anode of the diode D1 is connected to the input 10.

The charge or voltage stored on the capacitor C1 serves for the control of an NMOS transistor Q1-NMOS. For this purpose, the terminal of the capacitor C1 connected to the cathode of the diode D1 is wired to a control terminal 20 or to the gate of the transistor Q1-NMOS.

The transistor Q1-NMOS serves as a controllable resistor. The control occurs via the control terminal 20. The control path 16 of the transistor is formed by its channel. A terminal 14 of the control path 16 is connected to the output 12. The second terminal 18 of the control path 16 is connected to the input 10.

When the voltage Vin proportional to the supply voltage drops at the input 10, a voltage present at the circuit node and, thus, at the output 12 usually also drops. The charge stored on the capacitor C1 and, thus, the corresponding voltage, however, is preserved since the charge cannot flow off via the now-inhibited diode D1. Due to the lowering of the voltage at the output 12 and first terminal 14 compared to the voltage at the control terminal 20, the transistor Q1-NMOS switches into a conductive condition. A charge stored on the circuit node that is connected to the output 12 can thus flow off as current Iout into the output 12 via the control path 16 of the transistor.

The transistor remains conductive until the charge stored on the capacitor C1 has flowed off due to parasitic effects. This event normally lasts a number of minutes, i.e. far longer than the discharging of the circuit node. In the normal operating condition wherein the voltage Vin is present at the input 10 and approximately corresponds to the supply voltage, the transistor Q1-NMOS is inhibited since its gate-source voltage (the difference in potential between the control terminal 20 and the first terminal 14) is lower than the threshold voltage for the activation of the transistor.

Figure 6:
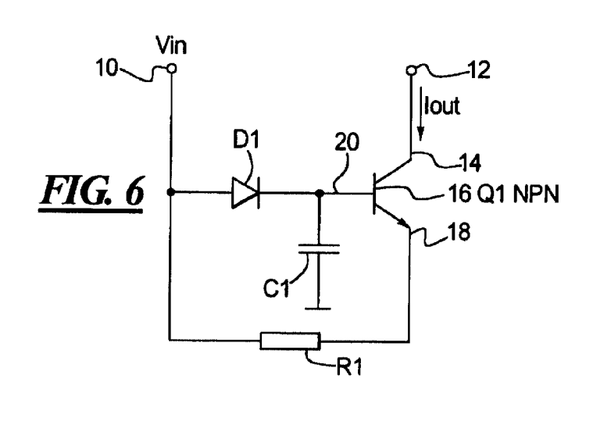
FIG. 6 is a second exemplary embodiment of the circuit arrangement.

FIG. 6 shows a circuit arrangement wherein an NPN bipolar transistor Q1-NPN is employed instead of the NMOS transistor shown in FIG. 5. Further, the emitter, as second terminal 18 of the control path 16 of the transistor Q1-NPN, is connected via a resistor R1 to the input 10. The maximum discharge current Iout is limited as a result thereof. This particularly serves the purpose of protecting the circuit arrangement against damage that can particularly occur in applications with a very high voltage. The voltage-stable NPN bipolar transistor Q1-NPN is especially suited for this purpose. Given the circuit shown in FIG. 6, however, it must be noted that a base current that discharges the capacitor C1 flows as a result of the NPN bipolar transistor Q1-NPN. Accordingly, a larger capacitor C1 is required than in the case of FIG. 5.

Figure 7:
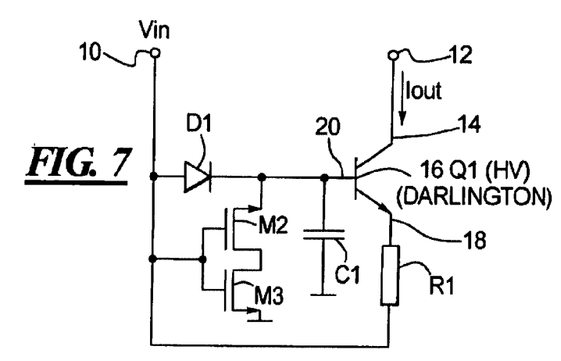
FIG. 7 is a third exemplary embodiment of the circuit arrangement with a clamping circuit.

FIG. 7 shows a circuit arrangement with a Darlington transistor Q1 (HV). This circuit is suited for high-voltage areas of employment. A circuit node can be very quickly discharged due to the high gain of the Darlington transistor. A clamping circuit formed by two MOS transistors M2 and M3 also prevents the capacitor C1 from charging due to unwanted parasitic effects.

Figure 8:
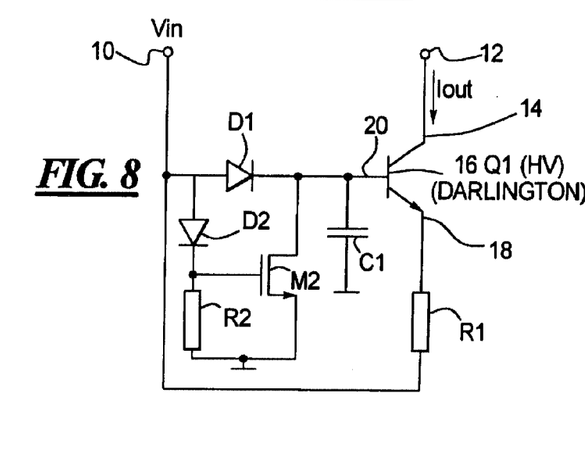
FIG. 8 is a fourth exemplary embodiment of the circuit arrangement with a voltage-controlled power source.

A voltage-controlled power source as in FIG. 8 can also be employed instead of the clamping circuit. The voltage-controlled power source of FIG. 8 comprises a second diode D2 whose anode is wired to the anode of the first diode D1. The cathode of the second diode D2 is connected to ground via a resistor R2. An MOS transistor M2 limits the voltage at the capacitor C1.

The transistor M2 is circuited in the following way for this purpose: The gate terminal is wired to the connection between the cathode of the second diode D2 and the resistor R2; source is connected to the terminal of the capacitor C1 that is in turn wired with the control terminal 20 of the transistor Q1 (HV); finally, drain is connected to ground. The voltage divider formed by the second diode D2 and the resistor R2 controls, so-to-speak, the transistor M2 such that the voltage at the capacitor C1 is limited as soon as it exceeds a voltage prescribed by the voltage divider since the transistor M2 begins to conduct and thus limits the voltage at the capacitor C1.

Figure 9:
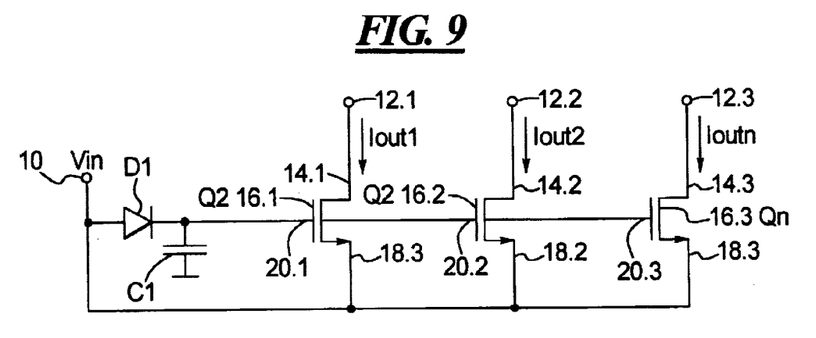
FIG. 9 is a fifth exemplary embodiment of the circuit arrangement for parallel discharge of a plurality of circuit nodes.

FIG. 9 shows a circuit arrangement for the parallel discharge of a plurality of circuit nodes. For this purpose, the arrangement comprises MOS transistors Q1, Q2 through Qn corresponding in number to the plurality of circuit nodes to be discharged. The transistor are connected parallel such that their control or, respectively, gate terminals 20.1, 20.2 and 20.3 are interconnected and connected to a terminal of a capacitor C1. Further, the interconnected gate terminals 20.1, 20.2 and 20.3 are connected to the cathode of a diode D1 whose anode is wired with an input 10 at which a voltage Vin is present. Further, the drain terminals or second terminals of the control paths 16.1, 16.2 and 16.3 of the transistors are connected in common to the input 10. The circuit arrangement comprises outputs 12.1, 12.2 and 12.3 that respectively correspond to the source terminals 14.1 or 14.2 or, respectively, 14.3 of the transistors 16.1 or, respectively, 16.2 or 16.3.

This circuit arrangement achieves a great saving in surface since only one diode D1 and one capacitor C1 need be provided for discharging a plurality of circuit nodes. Although a transistor $Q_1$, $Q_2$ and Qn must be respectively available for each circuit node, these transistors are not as decisive for the surface requirement of the overall circuit arrangement as the capacitor C1. The latter, however, is used in common for all circuit nodes that are to be discharged.

The exemplary embodiment described below in conjunction with FIG. 6 derives from the automotive sector. It is employed for recognizing a line break at sensors in the automotive sector. The technological background shall be described in brief and a comparison to the Prior Art undertaken before explaining the circuit structure.

Given analog output stages such as, for example, amplifiers, it is often necessary that a break in a supply line be recognized in that an output pin both given pull-up as well as given pull-down loads assumes a potential as close as possible to the ground potential, for instance in the mV range, or assumes a positive supply voltage.

When a clamping stage or circuit guarantees in normal operation that the potential at the output pin is always found between two voltage ranges, an external application can detect the line break.

In order to realize this function, self-conducting JFETs JFET1 and JFET2 that were connected to the output pin were employed in a spectrum of pressure sensors and Hall sensors.

Figure 10:
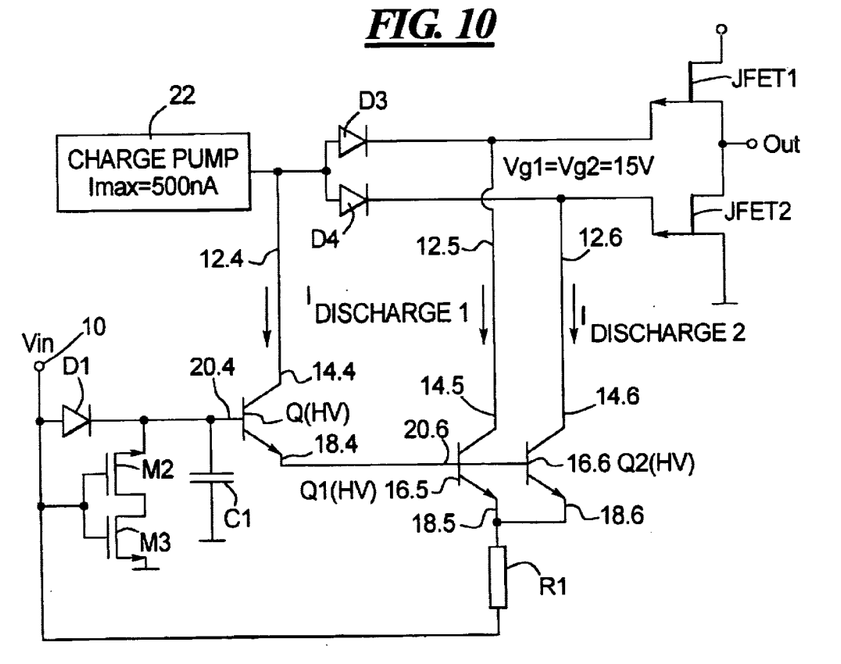
FIG. 10 is a sixth exemplary embodiment of the circuit arrangement that is utilized as a pull-down resistor for discharging the gates of JFETs.

In normal operation, the JFETs JFET1 and JFET2 of the circuit are high-impedance and their gates are pumped to a voltage up to 15 V with a charge pump 22. The charge pump 22 delivers a maximum current of about 500 nA that charges the gates of the JFETs JFET1 and JFET2 via diode D3 and D4. So that the application can detect a supply line break very quickly, the JFETs JFET1 and JFET2 must rapidly become conductive, i.e. their gates must be very quickly discharged. Without special measures, however, the gates only discharge via the leakage currents of the charge pump; this process can last minutes.

When passive pull-down resistors are employed, they must be selected high-impedance enough so that they do not load the charge pump. At approximately 15 V and approximately 1 us quadrature axis current component, the resistance would amount to about 15 MOhm. The realization of such a resistance would occupy a large area on an integrated circuit. When, for example, a technology with a polysilicon high-impedance resistor of 1.8 kOhm/square is employed, approximately 8333 squares with an overall area of approximately 75,000 $\mu m^2$ would have to be realized. The effective size on the layout of the integrated circuit is more than twice as big since the resistor must be realized in serpentine fashion. Overall an area of about 150,000 $\mu m^2$ would derive. This area is doubled because two gates must be discharged and, accordingly, two pull-down resistors are needed, i.e. an area of 3000,000 $\mu m^2$ is ultimately required.

The area outlay of the circuit arrangement shown in FIG. 10, in contrast, is only approximately 12,000 $\mu m^2$, i.e. approximately 25 times smaller than the passive pull-down resistors.

The circuit of FIG. 10 shows a BICMOS version of the circuit arrangement that can be used as pull-down resistor. The area savings compared to the above-described Prior Art is very great and amounts to more than approximately 90%.

A voltage Vin is present at the input 10, the voltage being a reference voltage generated in the chip, for example a band-gap voltage of about 3 V. As long as this voltage amounts to about 3 V in normal operation, the npn-bipolar transistors Q (HV), Q1 (HV) and Q2 (HV) inhibit; and the capacitor or the capacitance C1 charges due to the voltage Vin and due to the inverse saturation current of the collector-base diode of the transistor Q (HV).

Without the clamping circuit with the MOS transistors M2 and M3, the potential at the capacitor would rise due to the last-mentioned charging mechanism until the base-emitter paths of the transistors Q1 (HV), and Q2 (HV) would transmit.

When the voltage Vin drops to about 0 V as a result of an interruption of the supply voltage, the transistors Q1 (HV), and Q2 (HV) begin to conduct and discharge the voltages at the gates of the JFETs JFET1 and JFET2. As long as these are higher than the saturation voltage of the transistors Q1 (HV) and Q2 (HV), the (storage) capacitor C1 only discharges with a very small current (from $I_{discharge}$/BETA2).

Only when the saturation voltage of the transistors Q1 (HV) and Q2 (HV) is reached, i.e. the voltages at the gates of the JFETs now respectively amount to only approximately 100 mV, does the base current of the transistors Q1 (HV) and Q2 (HV) rise, and only then does the voltage at the capacitor C1 drop faster.

The following inequality should apply in order to nearly completely bring the charges from the gates of the JFETs JFET1 and JFET2:

$Q1 * BETA^2(worst) > Q(JFET)$ $C1 * Vc * BETA^2(worst) > Vgate * C(JFET).$

Q1 is thereby the charge stored on the capacitor C1, Q(JFET) is the charge on the gates of the JFETs JFET1 and JFET2, and BETA is the current gain of the bipolar transistors. Vgate is the voltage at the gates of the JFETs JFET1 and JFET2, C(JFET) is the capacitance of the gates of the JFETs JFET1 and JFET2. The maximum discharge current can be limited by the resistor R1.

In summary, the use of this circuit in this exemplary embodiment enables an area savings of more than 90% compared to a solution with a passive pull-down resistor; a very fast discharge of the gates in a few micro-seconds occurs instead of a few milliseconds given employment of passive resistors. Such a fast detection of a break of the supply lines is, for example, of critical significance in the field of sensors and actuators in the automobile industry.

Figure 11:
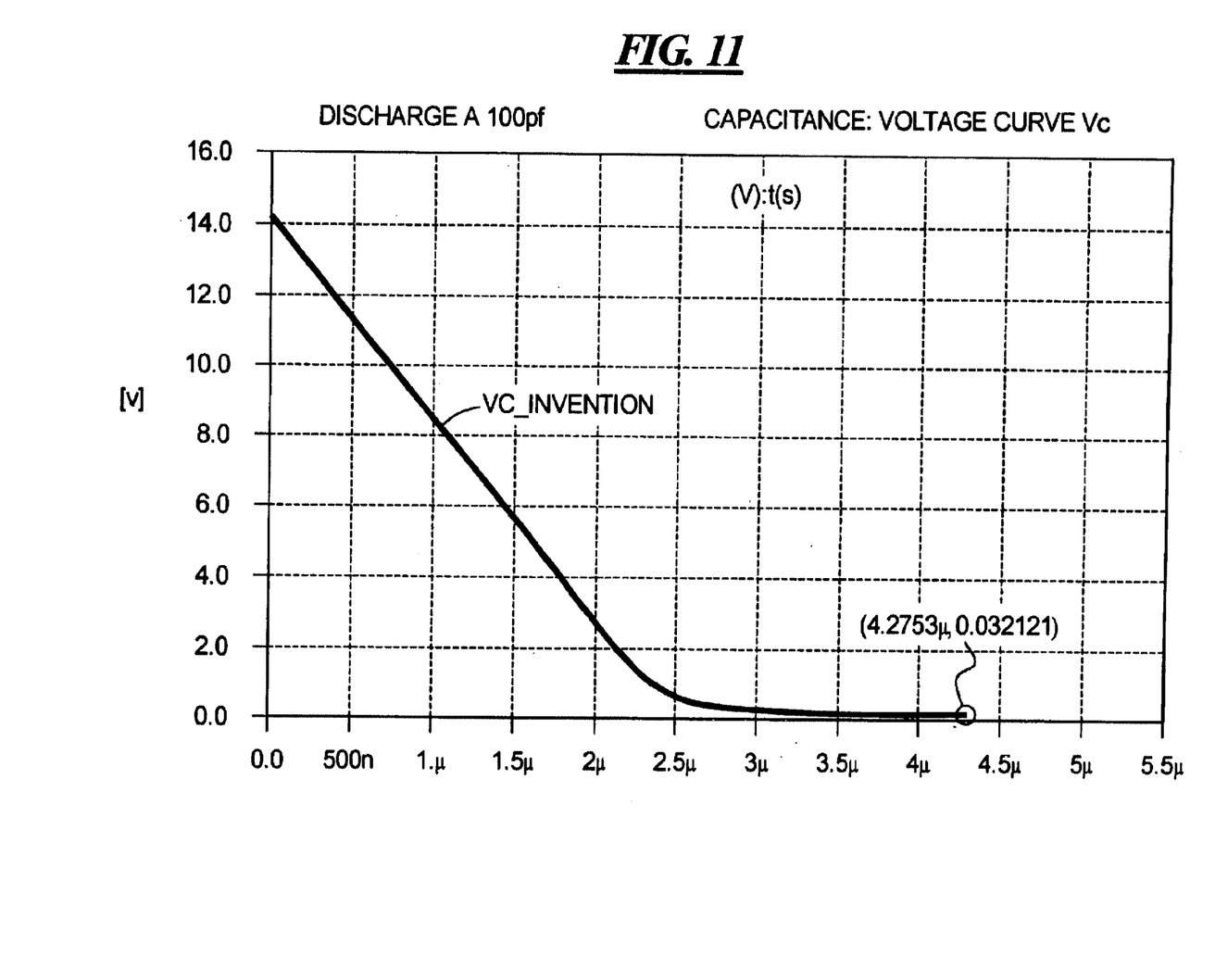
FIG. 11 is a time-voltage diagram with a discharge curve of a circuit node that is discharged with the circuit arrangement.

Simulation results in FIG. 11 show the effect of the circuit arrangement. The discharge of a capacitance of about 100 pF that is charged to about 15 V with a circuit arrangement was thereby simulated. In this exemplary simulation, the capacitance was capable of being nearly completely discharged within approximately 3 $\mu s$. What is thereby striking is that the illustrated discharge curve proceeds nearly linearly from about 0 through 2.25 $\mu s$ in order to then approach a voltage value of about 0 V within a short time span of about 1.25 $\mu s$. A measured value taken at a point in time of about 4.27 $\mu s$ exhibits a voltage value of only approximately 3 mV.

Figure 12:
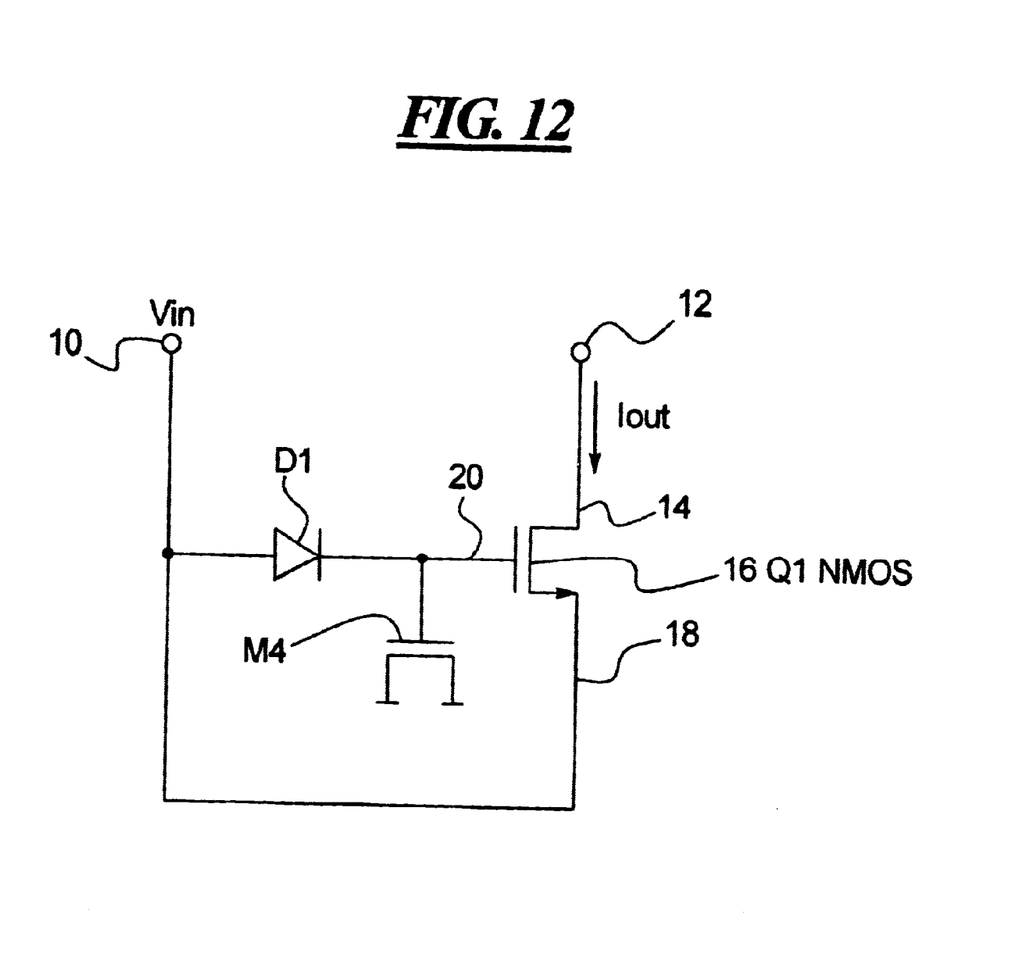
FIG. 12 is a seventh exemplary embodiment of the circuit arrangement employing an MOS transistor acting as a capacitor.

FIG. 12 shows a circuit arrangement wherein the MOS transistor M4 is employed acting as the capacitor C1 shown in FIG. 5. The gate terminal is connected to the cathode of diode D1 at the terminal 20. Both source and drain terminals are connected to ground.

While preferred embodiments have been illustrated and described in detail in the drawings and foregoing description, the same are to be considered as illustrative and not restrictive in character, it being understood that only the preferred embodiments have been shown and described and that all changes and modifications that come within the spirit of the invention both now or in the future are desired to be protected.

I claim as my invention:

1. A circuit arrangement for discharging at least one circuit note, comprising:

an input and at least one output, the output being used to discharge the at least one circuit node;

at least one controllable resistor, a capacitor and a diode;

a first terminal of a controllable path of the controllable resistor being connected to the output;

a second terminal of the controllable path of the controllable resistor being connected to the input;

a first terminal of the capacitor and a cathode of the diode being connected to a control terminal of the controllable resistor and an anode of the diode being connected to the input; and a second terminal of the capacitor being connected to ground.

2. The circuit arrangement according to claim 1 wherein the second terminal of the controllable path of the controllable resistor is connected to the input via a resistor.

3. The circuit arrangement according to claim 1 wherein the first terminal of the capacitor is connected to a clamping circuit.

4. The circuit arrangement according to claim 3 wherein the clamping circuit is dimensioned such that a discharge of the capacitor is prevented given a decrease in a voltage present at the input.

5. The circuit arrangement according to claim 3, wherein the clamping circuit is designed such that it limits a voltage at the capacitor to a sum voltage that approximately corresponds to a sum of a voltage present at the input and a threshold voltage of the controllable resistor.

6. The circuit arrangement according to claim 1, wherein the first terminal of the capacitor is connected to a voltage-controlled power source.

7. The circuit arrangement according to claim 6 wherein the voltage power source is dimensioned such that a discharge of the capacitor is prevented given a decrease in a voltage present at the input.

8. The circuit arrangement according to claim 1 wherein the at least one controllable resistor comprises at least one transistor.

9. The circuit arrangement according to claim 8 wherein the at least one transistor comprises one of an NMOS transistor, an NPN bipolar transistor, and a superbeta transistor.

10. The circuit arrangement according to claim 1 wherein said circuit arrangement is designed for discharging said at least one circuit node wherein said at least one circuit node is a capacitance of about 100 pf charged to approximately 15 v and wherein the circuit node is nearly completely discharged after approximately 3 $\mu$s.

11. The circuit arrangement according to claim 1 wherein the circuit arrangement comprises an integrated circuit.

12. The circuit arrangement according to claim 11 wherein the capacitor is formed by an MOS transistor.

13. An integrated circuit, comprising:
a circuit arrangement for discharging at least one circuit node of the integrated circuit, said circuit arrangement comprising
an input and at least one output,
at least one controllable resistor, a capacitor and a diode,
a first terminal of a controllable path of the controllable resistor being connected to the output,
a second terminal of the controllable path of the controllable resistor being connected to the input,
a first terminal of the capacitor and a cathode of the diode being connected to a control terminal of the controllable resistor and an anode of the diode being connected to the input, and
a second terminal of the capacitor being connected to ground,
said at least one output being connected to said at least one circuit node of the integrated circuit; and
a voltage that derives from a voltage source of the integrated circuit being present at the input.

14. The integrated circuit according to claim 13 wherein said integrated circuit comprises a sensor circuit.

15. A method for discharging at least one circuit node, comprising the steps of:
storing a charge on a capacitor; and
delaying a discharge of said charge even after a disconnect of a supply voltage, and a controllable resistor being controlled such that after a disconnect of the supply voltage, the controllable resistor is conductive for a predetermined time duration within which the circuit node discharges nearly completely.

16. The method according to claim 15 wherein the method is implemented with a circuit arrangement for discharging the at least one circuit node wherein an input and an at least one output is provided, at least one controllable resistor, a capacitor, and a diode is provided, a first terminal of a controllable path of the controllable resistor being connected to the output, a second terminal of the controllable path of the controllable resistor being connected to the input, and a first terminal of the capacitor and a cathode of the diode being connected to a control terminal of the controllable resistor and an anode of the diode being connected to the input, and a second terminal of the capacitor being connected to ground.

17. A method according to claim 15 wherein said controllable resistor having a control input connecting to a diode and a capacitor.

18. A circuit arrangement for discharging at least one circuit note, comprising:
an input and at least one output, the output being used to discharge the at least one circuit node;
at least one controllable resistor, a capacitor and a diode;
a first terminal of a controllable path of the controllable being connected to the output;
a second terminal of the controllable path of the controllable resistor being connected to the input;
a terminal of the capacitor and a cathode of the diode being connected to a control terminal of the controllable resistor and an anode of the diode being connected to the input;
the terminal of the capacitor also being connected to a clamping circuit; and
the clamping circuit being designed such that it limits a voltage of the capacitor to a sum voltage that approximately corresponds to a sum of a voltage present at the input and a threshold voltage of the controllable resistor.

19. A circuit arrangement for discharging at least one circuit node, comprising:
an input and at least one output, the output being used to discharge the at least one circuit node;
at least one controllable resistor, capacitor and a diode;
a first terminal of a controllable path of the controllable resistor being connected to the output;
a second terminal of the controllable path of the controllable resistor being connected to the input;
a terminal of the capacitor and a cathode of the diode being connected to a control terminal of the controllable resistor and an anode of the diode being connected to the input;
the terminal of the capacitor being connected to a voltage-control power source; and
the power source being dimensioned such that a discharge of the capacitor is prevented given a decrease in a voltage present at the input.

* * * * *